United States Patent
Nagata (10) Patent No.: US 6,545,557 B2
(45) Date of Patent: Apr. 8, 2003

(54) FM SIGNAL OSCILLATOR CIRCUIT AND MODULATION LEVEL CONTROL METHOD

(75) Inventor: Minoru Nagata, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/880,918

(22) Filed: Jun. 15, 2001

(65) Prior Publication Data

US 2002/0027479 A1 Mar. 7, 2002

(30) Foreign Application Priority Data

Jun. 30, 2000 (JP) ........................................ 2000-199437

(51) Int. Cl.$^7$ ................................................ H03C 3/02
(52) U.S. Cl. ........................................ 332/123; 332/135
(58) Field of Search ........................... 332/135, 117, 332/125, 123, 126, 141, 128, 127; 331/183, 182, 117 R, 177 V, 117 FE, 117 D, 175

(56) References Cited

U.S. PATENT DOCUMENTS

| 5,818,306 A | * | 10/1998 | Lee et al. | ............... | 331/117 FE |
| 5,952,895 A | * | 9/1999 | McCune et al. | ............ | 332/128 |
| 6,008,702 A | * | 12/1999 | Yamamoto | .............. | 331/117 D |
| 6,292,064 B1 | * | 9/2001 | Nagata | .................. | 331/117 FE |
| 6,362,698 B1 | * | 3/2002 | Gupta | ......................... | 330/310 |

FOREIGN PATENT DOCUMENTS

JP        11-97928        4/1999

OTHER PUBLICATIONS

T. Inaba, Teihon Hassinkairo no sekkei to ouyou, Chap. 8 Sec. 5, Ceramic sindousi wo siyou sita VCO, CQ Shuppan, Dec. 25, 1993, pp. 258 & 259.

* cited by examiner

Primary Examiner—Terry D. Cunningham
Assistant Examiner—Quani Tra
(74) Attorney, Agent, or Firm—Oblon, Spivak, McClelland, Maier & Neustadt, P.C.

(57) ABSTRACT

An FM signal oscillator circuit includes a resonator having a graded- or abrupt-junction variable capacitance diode that is producible through standard IC manufacturing processes but causes an inconstant modulation level. The FM signal oscillator circuit, therefore, is provided with a function of maintaining a constant modulation level irrespective of oscillation frequencies. Namely, to maintain a constant modulation level without regard to oscillation frequencies that change depending on a control voltage applied to the variable capacitance diode, the FM signal oscillator circuit employs a variable gain amplifier whose gain changes in response to the control voltage. The variable gain amplifier amplifies a modulating signal, and the amplified modulating signal is superimposed onto the control voltage. The superimposed signal is applied to the variable capacitance diode, and a driver of the FM signal oscillator circuit provides an FM signal whose modulation level is constant irrespective of the control voltage that may vary. With this configuration, the FM signal oscillator circuit is producible as an integrated circuit through standard IC manufacturing processes at low cost.

22 Claims, 8 Drawing Sheets

FIG.5B $\frac{df_o}{dV_c}$

FIG.5C

FIG.5D $\frac{df_o}{dV_m}$

FM SIGNAL OSCILLATOR CIRCUIT AND MODULATION LEVEL CONTROL METHOD

CROSS REFERENCE TO RELATED APPLICATIONS

This application claims benefit of priority under 35 USC 119 based on Japanese Patent Application No. P2000-199437 filed on Jun. 30, 2000, the entire contents of which are incorporated by reference herein.

BACKGROUND OF THE INVENTION

1. Field of the Invention

The present invention relates to an FM (frequency-modulated) signal oscillator circuit and a modulation level control method, and more particularly, to a FM signal oscillator circuit that has a voltage-controlled oscillator including a resonator that employs a variable capacitance diode to provide an FM signal.

2. Description of Related Art

The FM signal oscillator circuit employing a voltage-controlled oscillator receives a control voltage to set an oscillation frequency of the voltage-controlled oscillator and a modulating signal to minutely change the control voltage, and provides an FM signal. When modulating the oscillation frequency by changing the control voltage, the FM signal oscillator circuit must keep a modulation level specified by radio regulations.

Figure 1:
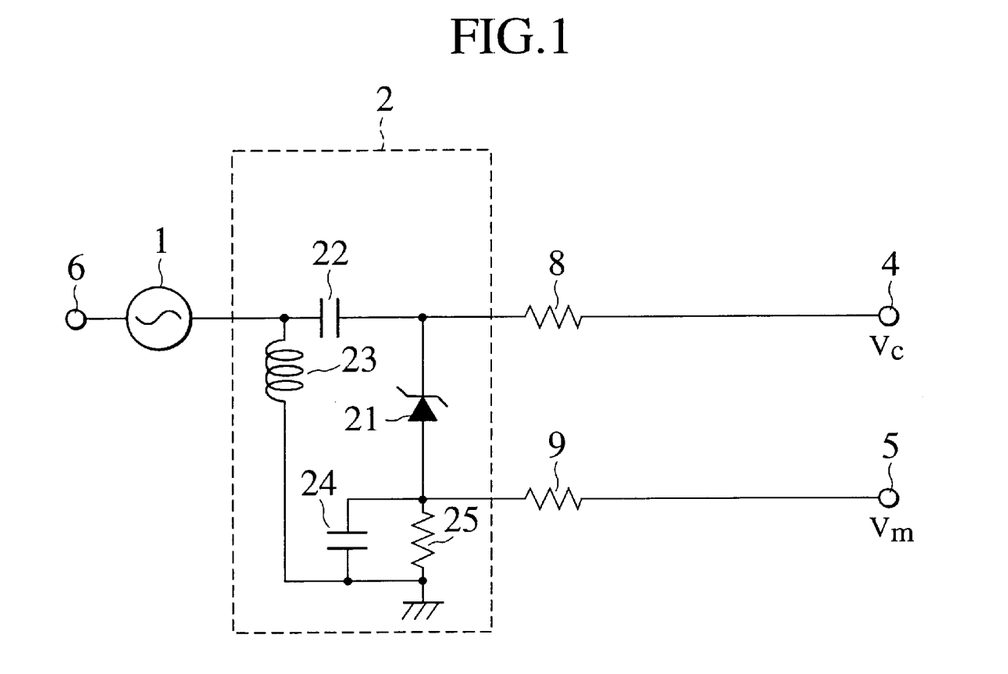
FIG. 1 is a circuit diagram showing an FM signal oscillator circuit according to a related art.

FIG. 1 is a circuit diagram showing an FM signal oscillator circuit according to a related art. This circuit includes a voltage-controlled oscillator having a resonator that employs a variable capacitance diode to provide an FM signal. More precisely, the FM signal oscillator circuit has a driver 1, the resonator 2, and resistors 8 and 9 to supply a control voltage Vc and a modulating signal Vm to the resonator 2.

The resonator 2 is an LC resonator including the variable capacitance diode 21, a capacitor 22, a coil 23, a capacitor 24, and a resistor 25. The capacitor 24 and resistor 25 form a parallel circuit. The driver 1 and resonator 2 form the voltage-controlled oscillator.

The control voltage Vc is supplied to a frequency control input terminal 4 from which to the resistor 8 and then to a cathode of the diode 21. The control voltage Vc determines a capacitance of the diode 21, and thus, a resonance frequency of the resonator 2 or an oscillation frequency fo of the voltage-controlled oscillator composed of the driver 1 and resonator 2. An output terminal 6 provides an oscillating output signal.

The modulating signal Vm is supplied to an input terminal 5 from which to the resistor 9 and then to an anode of the diode 21. In response to the modulating signal Vm, the capacitance of the diode 21 slightly changes to change the resonance frequency of the resonator 2 around fo, thereby provide an FM signal from the output terminal 6.

According to the related art, the variable capacitance diode 21 of the resonator 2 must have a hyper abrupt junction, so that the voltage-controlled oscillator may maintain a constant modulation level even if the control voltage Vc is changed. Namely, the oscillation frequency fo must be changed by changing the control voltage Vc without fluctuating a modulation level.

Figure 2:
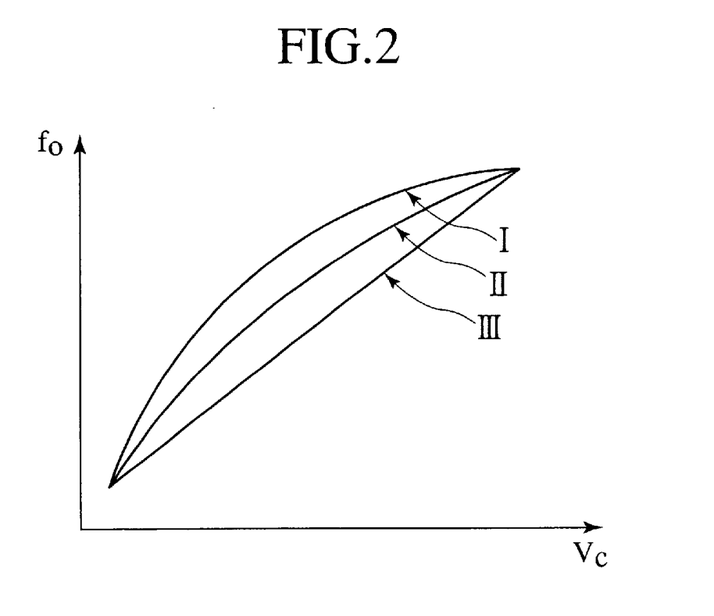
FIG. 2 is a graph showing the control voltage-oscillation frequency characteristics of variable capacitance diodes with different junction structures.

FIG. 2 is a graph showing the control voltage (Vc)-oscillation frequency (fo) characteristics of variable capacitance diodes with graded junction (I), abrupt junction (II), and hyper abrupt junction (III). The hyper-abruptjunction diode (III) shows linear Vc-fo characteristics to maintain a constant modulation level even if the control voltage Vc is changed to vary the oscillation frequency fo. The graded-junction diode (I) and abrupt-junction diode (II) show nonlinear Vc-fo characteristics to alter a modulation level when the control voltage Vc is changed to change the oscillation frequency fo.

A problem of the FM signal oscillator circuit employing the hyper-abrupt-junction diode is that it is unable to produce through standard IC (integrated circuit) manufacturing processes because the standard processes are only capable of forming abrupt- or graded-junction diodes on ICs. To form hyper-abruptjunction diodes on ICs, additional manufacturing processes must be involved to increase the cost of the ICs.

SUMMARY OF THE INVENTION

The present invention is to provide an FM signal oscillator circuit and a modulation level control method, capable of employing abrupt- or graded junction variable capacitance diodes for a resonator without changing a modulation level, so that the circuit may be produced as an IC through standard IC manufacturing processes.

An FM signal oscillator circuit includes a resonator having a variable capacitance diode whose capacitance is set according to a control voltage, the variable capacitance diode changing a resonance frequency of the resonator, a driver configured to drive the resonator and providing an FM signal, a corrector configured to correct the level of a modulating signal according to resonance-frequency-changing characteristics of the resonator and applying a signal corresponding to the corrected modulating signal and a signal corresponding to the control voltage to the variable capacitance diode.

The FM signal oscillator circuit according to this invention enables to employ graded- or abrupt-junction variable capacitance diodes to fabricate a resonator of the FM signal oscillator circuit that is capable of maintaining a constant modulation level when an oscillation frequency is changed. Due to the graded- or abrupt-junction diodes, this oscillator circuit is manufacturable through standard IC manufacturing processes at low cost.

DESCRIPTION OF THE EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 3:
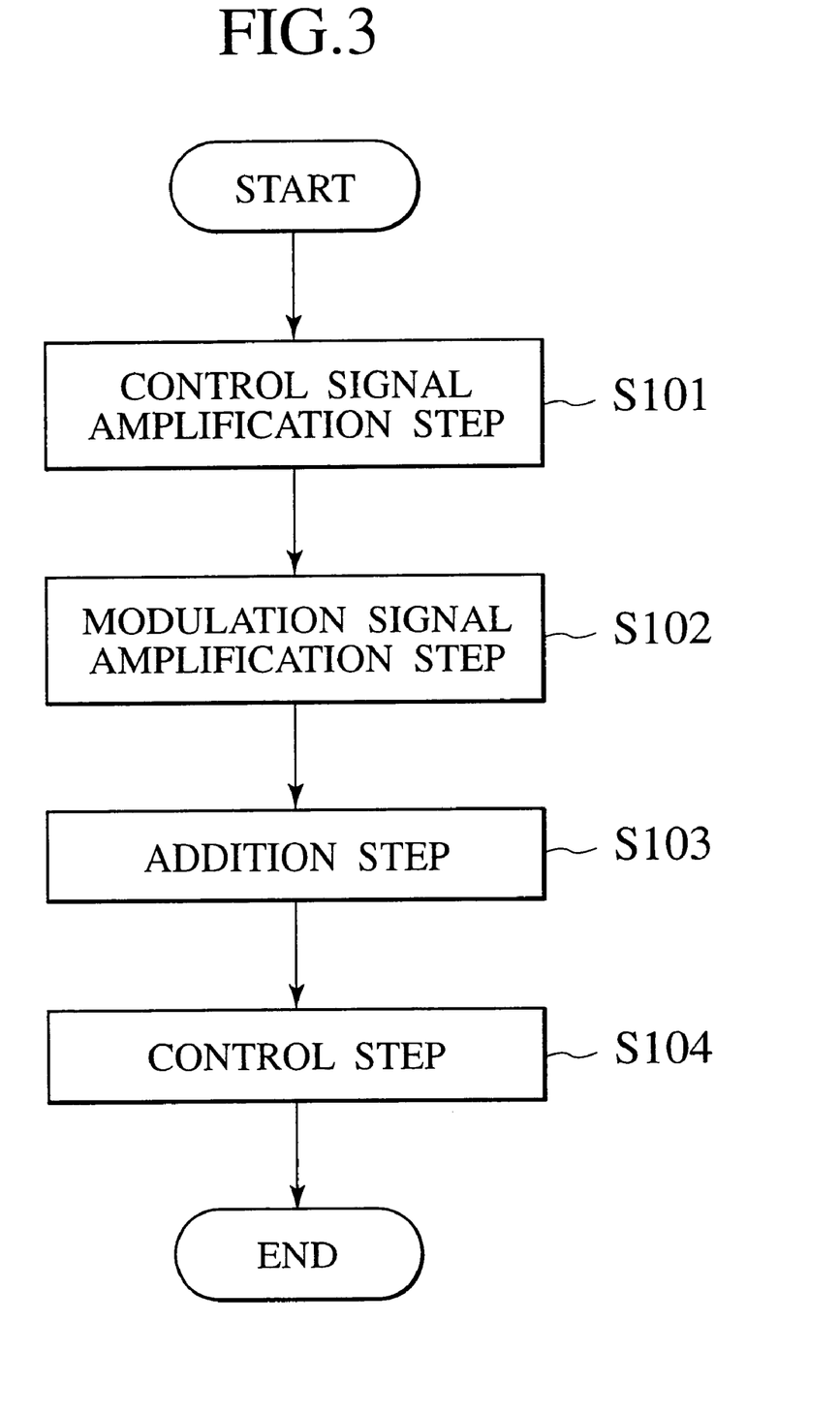
FIG. 3 is a flowchart showing a modulation level control method according to an embodiment of the present invention.

FIG. 3 is a flowchart showing a modulation level control method according to an embodiment of the present invention. The method sets a center frequency according to a control signal, receives a modulating signal, modulates the center frequency according to the modulating signal in an oscillator having a variable capacitance element, and provides an FM (frequency-modulated) oscillating signal.

Step S101 receives the control signal and amplifies the same through an amplifier Step S102 amplifies the modulating signal according to a gain determined by the amplified control signal. When amplifying the modulating signal, this embodiment according to the invention substantially maintains the frequency modulation gain of the oscillator. Step S103 adds the amplified modulating signal to the control signal. Step S104 applies the sum to the variable capacitance element to control the resonance frequency of the oscillator.

Figure 4:
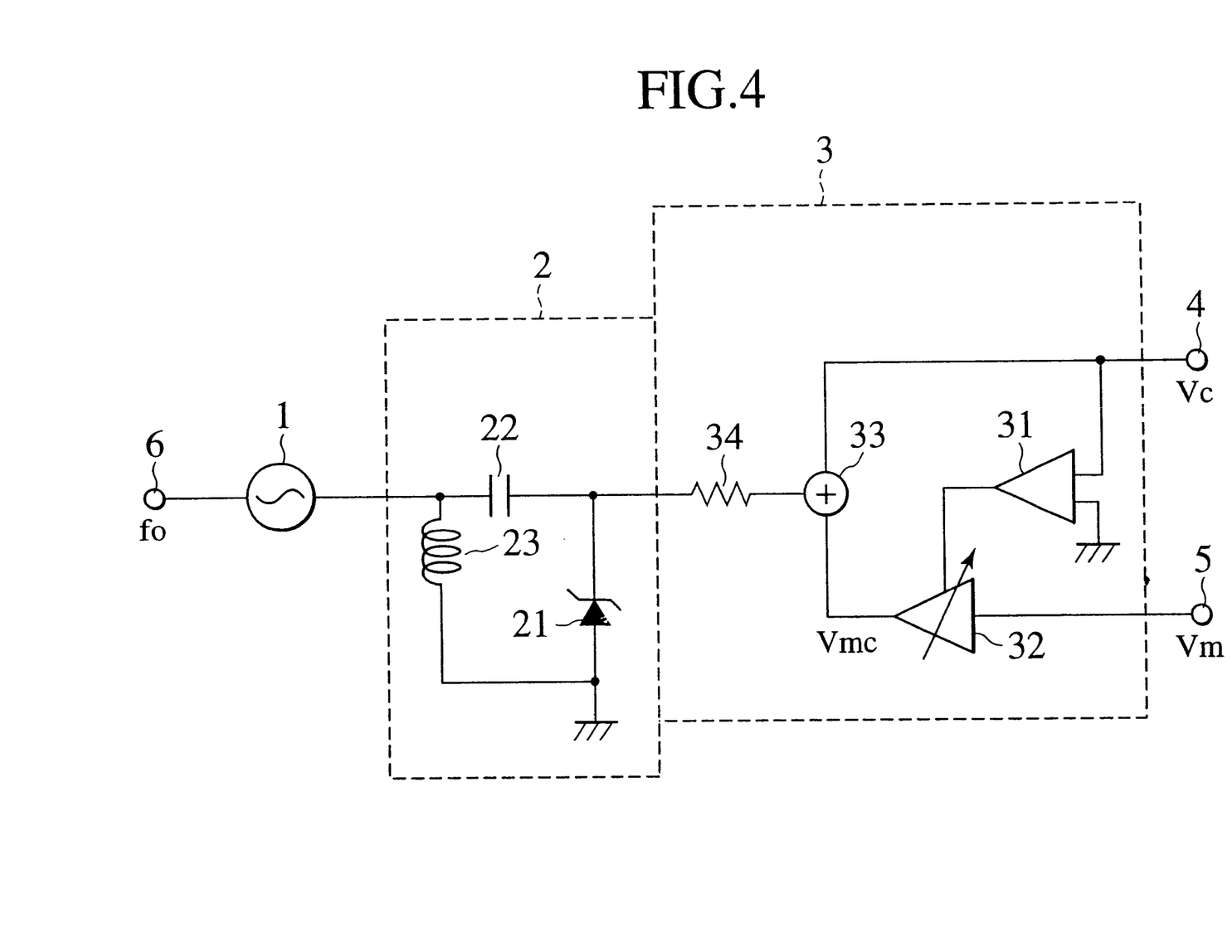
FIG. 4 is a circuit diagram showing an FM signal oscillator circuit according to a first embodiment of the present invention.

FIG. 4 is a circuit diagram showing an FM signal oscillator circuit according to the first embodiment of the present invention. The FM signal oscillator circuit includes a driver 1, a resonator 2, a modulating signal corrector 3, an input terminal 4 for receiving a control voltage Vc to set a center oscillation frequency fo, an input terminal 5 for receiving a modulating signal Vm, and an output terminal 6 for providing an FM (frequency-modulated) signal having the center frequency of fo.

The resonator 2 includes a variable capacitance diode 21, a capacitor 22, and a coil 23. The corrector 3 includes an operational amplifier 31, a variable gain amplifier 32, an adder 33, and a resistor 34. The diode 21 has, for example, a graded junction so that the diode 21 may be manufactured on a semiconductor IC through standard IC manufacturing processes.

The operation of the embodiment will be explained with reference also to FIGS. 5A to 5D. The control voltage Vc is received through the input terminal 4 and is amplified by the operational amplifier 31. The amplified control voltage is supplied to a control terminal of the variable gain amplifier 32, to set an amplification gain of the amplifier 32. The modulating signal Vm is received through the input terminal 5 and is amplified by the amplifier 32 according to the set gain, to provide an amplified modulating signal Vmc to the adder 33.

The adder 33 adds or superimposes the amplified modulating signal Vmc to the control voltage Vc. The superimposed signal is passed through the resistor 34 and is applied to a cathode of the variable capacitance diode 21.

The capacitance of the diode 21 is minutely changed by the amplified modulating signal Vmc around a capacitance value determined by the control voltage Vc. As a result, the driver 1 and resonator 2 provide, through the output terminal 6, an FM signal that varies according to the signal Vmc around the frequency fo determined by the control voltage Vc. A modulation level of the FM signal is determined by the signal Vmc, i.e., the gain of the variable gain amplifier 32 that is dependent on the control voltage Vc.

Figure 5A:
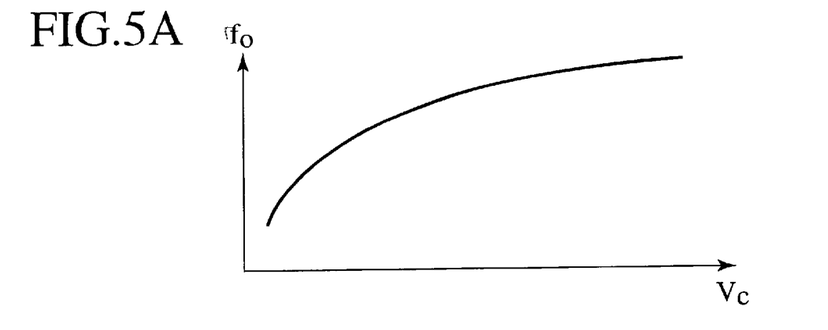
FIGS. 5A to 5D are graphs showing correction principles employed by the circuit of FIG. 4.

If the variable capacitance diode 21 has a graded junction and if no measures are taken to deal with the graded junction, the control voltage Vc to the input terminal 4 and the oscillating frequency fo of a voltage-controlled oscillator consisting of the driver 1 and resonator 2 show a relationship of FIG. 5A. In this case, the ratio "dfo/dVc" of a variation in fo to a change in Vc is as shown in FIG. 5B.

Figure 5B:
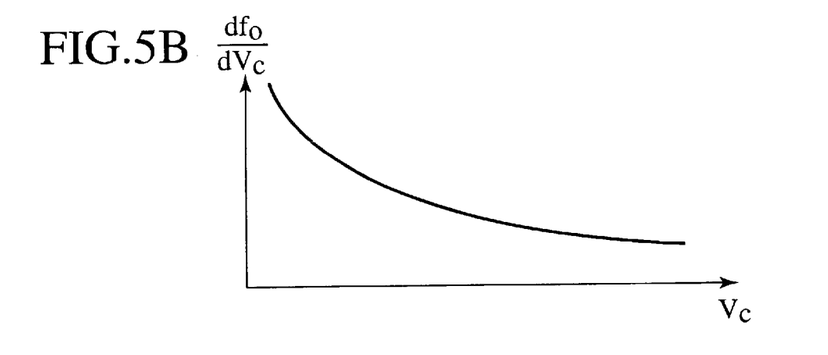
Figure 5C:
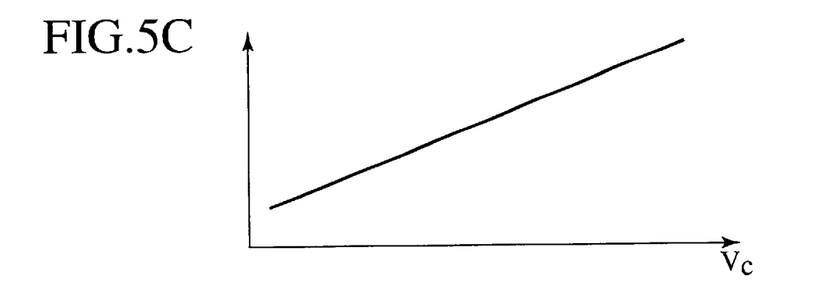
Figure 5D:
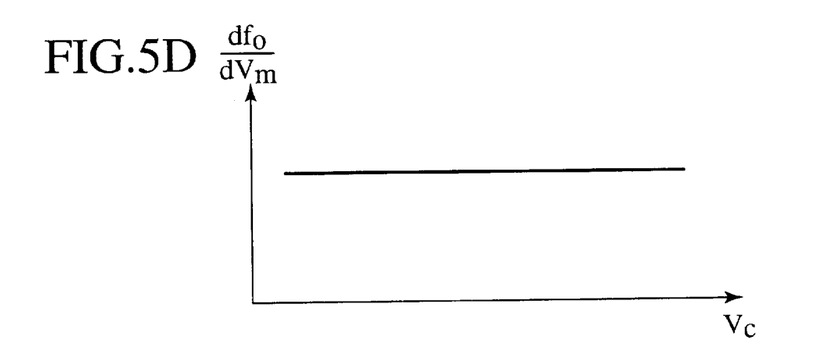

To correct the nonlinearity of FIG. 5B, the modulating signal Vm to the input terminal 5 is passed through the variable gain amplifier 32 having a gain characteristic curve of FIG. 5C, to provide the amplified modulating signal Vmc, which is added to the control voltage Vc in the adder 33 and is applied to the variable capacitance diode 21. As a result, a change in the control voltage Vc causes no change in a modulation level "dfo/dVm" with respect to the modulation signal Vm. Namely, a constant modulation level is maintained irrespective of a change in the control voltage Vc or oscillation frequency fo, by setting the gain of the variable gain amplifier 32 in response to the control voltage Vc.

The Vc-fo characteristics of FIG. 5A may be influenced by a graded-junction factor of the diode 21, the characteristics of the driver 1, and other factors. To cope with this, the gain control characteristics of the variable gain amplifier 32 may be adjusted to substantially maintain a constant modulation level with respect to the modulating signal Vm.

Figure 6:
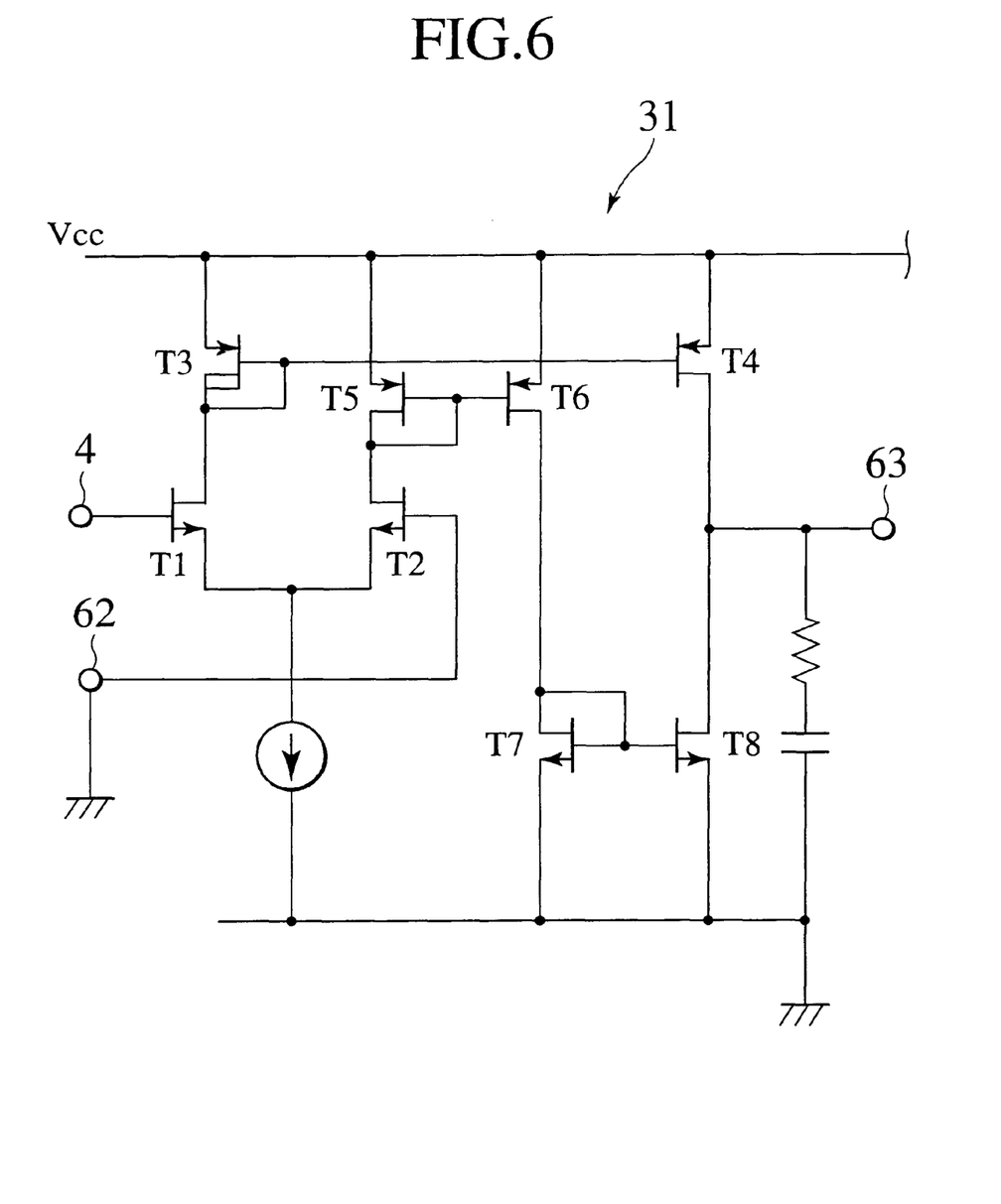
FIG. 6 is a circuit diagram showing the details of an operational amplifier contained in the circuit of FIG. 4.

FIG. 6 is a circuit diagram showing the details of the operational amplifier 31 of FIG. 4. Transistors T1 and T2 form a differential amplification stage that amplifies the control voltage Vc provided through the input terminal 4 (61). An input terminal 62 is grounded. Transistors T3 and T4 form a current mirror circuit, and therefore, a current passing through the transistors T1 and T3 is equal to a current passing through the transistor T4. Transistors T5 and T6 form a current mirror circuit, and therefore, a current passing through the transistors T2 and T5 is equal to a current passing through the transistors T6 and T7. The transistor T7 and a transistor T8 form a current mirror circuit, and therefore, a current passing through the transistors T6 and T7 is equal to a current passing through the transistor T8. As a result, an output terminal 63 provides a voltage corresponding to a difference between the currents passing through the transistors T4 and T8.

The operational amplifier 31 may be applicable to a comparator 39 to be explained later with reference to the third embodiment of FIG. 9. In the comparator 39, the input terminal 61 receives the control voltage and the input terminal 62 receives a voltage from resistors 37 and 38, so that the comparator 39 may provide a differential voltage.

Figure 7:
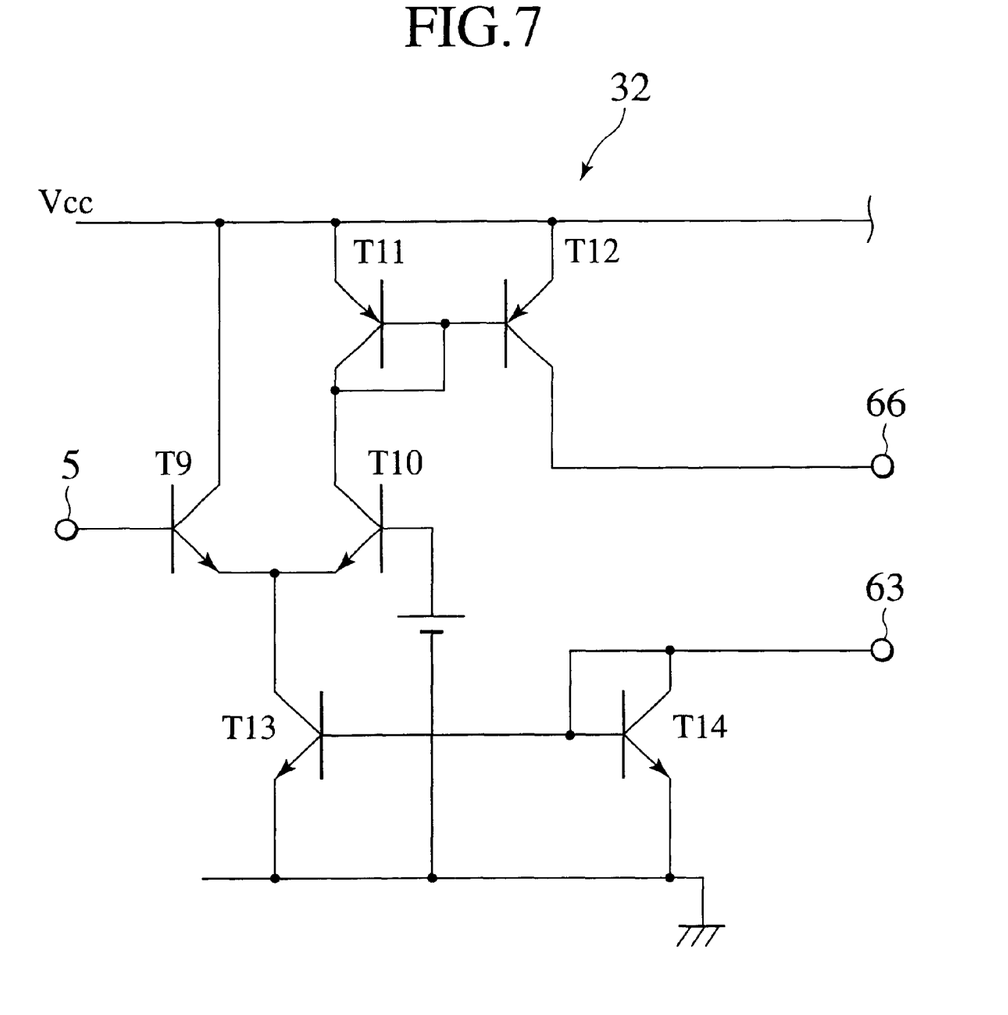
FIG. 7 is a circuit diagram showing the details of a variable gain amplifier contained in the circuit of FIG. 4.

FIG. 7 is a circuit diagram showing the details of the variable gain amplifier 32. Transistors T9 and T10 form an amplification stage. Transistors T13 and T14 form a current source and a current mirror circuit. The modulating signal Vm is received through the input terminal 5 and is amplified by the transistors T9 and T10. The amplified current is supplied to the transistor T11. The transistor T11 and a transistor T12 form a current mirror circuit, and therefore, the amplified current is passed through the transistor T12, to provide the amplified modulating signal Vmc from an emitter of the transistor 12.

A control terminal 63 receives the amplified control voltage from the operational amplifier 31, to change the current passing through the transistor T14. This changes the current passing through the transistor T13. Namely, the current of the current source connected to the amplification stage consisting of the transistors T9 and T10 changes to change an amplification gain of the amplification stage. This realizes variable gain amplification.

According to the embodiment, the variable capacitance diode 21 of the resonator 2 may have a graded junction to cause a nonlinear relationship between the control voltage Vc and the oscillation frequency fo. Even so, the embodiment uses the control voltage Vc to change the amplification gain of the variable gain amplifier 32 working on the modulating signal Vm, to maintain a constant modulation level irrespective of a change in the control voltage Vc, i.e., a change in the oscillation frequency fo.

Even with a variable capacitance diode of graded junction, the embodiment is capable of maintaining a constant modulation level with respect to every frequency to which the oscillation frequency fo is changed by changing the control voltage Vc. As a result, the variable capacitance diode 21 of the resonator 2 is producible through standard IC manufacturing processes without additional processes, to provide an integrated FM signal oscillator circuit. The FM signal oscillator circuit thus produced is of low cost and is capable of maintaining a constant modulation level even if a center oscillation frequency fo is changed by changing a control voltage Vc.

Figure 8:
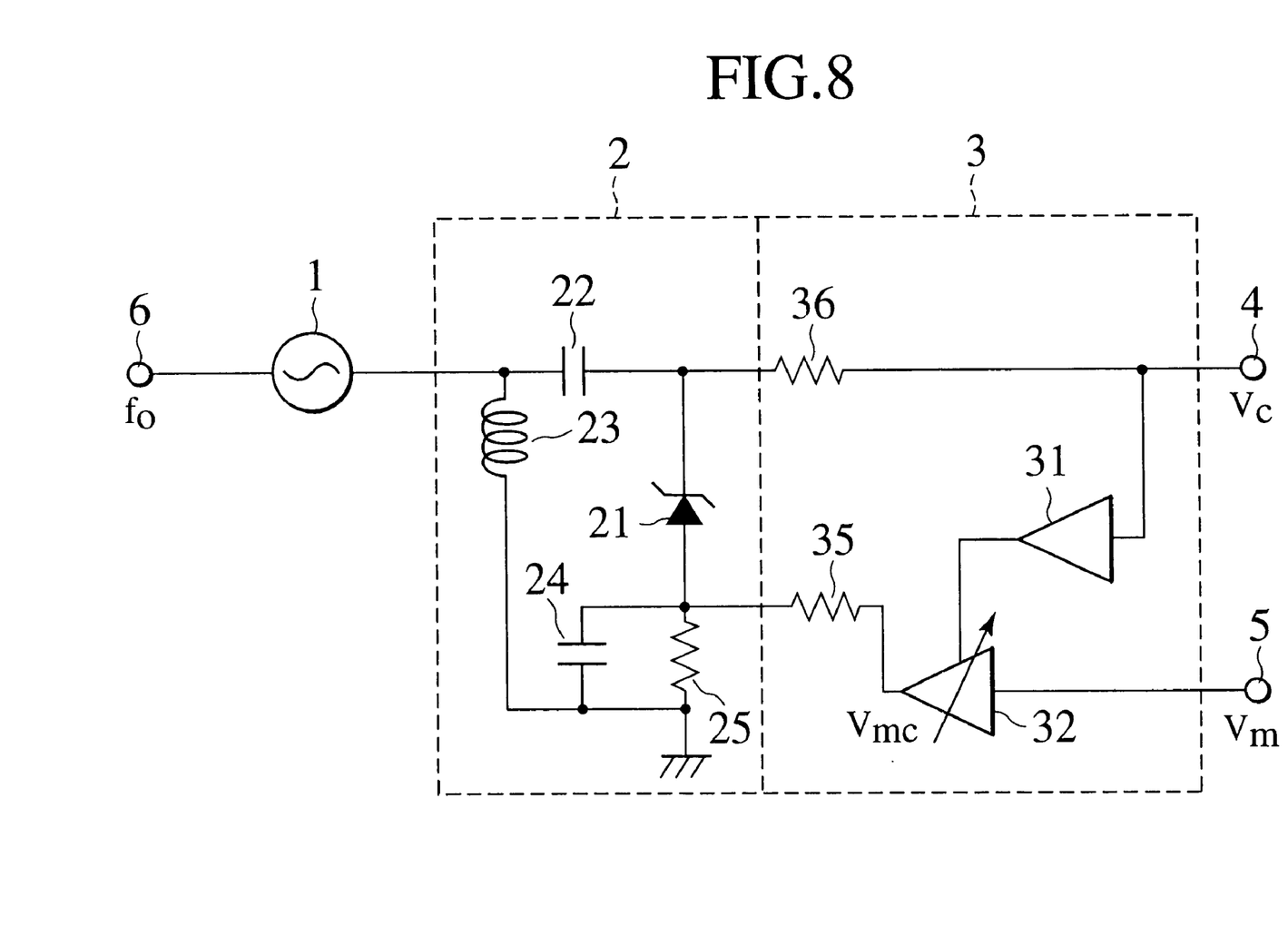
FIG. 8 is a circuit diagram showing an FM signal oscillator circuit according to a second embodiment of the present invention.

FIG. 8 is a circuit diagram showing an FM signal oscillator circuit according to the second embodiment of the present invention. This circuit includes a driver 1, a resonator 2, and a modulating signal corrector 3 like the first embodiment of FIG. 4.

The second embodiment differs from the first embodiment in that an amplified modulating signal Vmc from a variable gain amplifier 32 is passed through a resistor 35 and is applied to an anode of a graded-junction variable capacitance diode 21 contained in the resonator 2, and in that a control voltage Vc is passed through a resistor 36 and is applied to a cathode of the diode 21. The second embodiment eliminates the adder 33 of the first embodiment.

The second embodiment applies the control voltage Vc and amplified modulating signal Vmc to the cathode and anode of the variable capacitance diode 21, to realize the same effect as that of the first embodiment without an adder.

Between the anode of the diode 21 and the ground in the resonator 2, the second embodiment arranges a parallel circuit consisting of a capacitor 24 and a resistor 25, to apply the amplified modulating signal Vmc to the diode 21.

Figure 9:
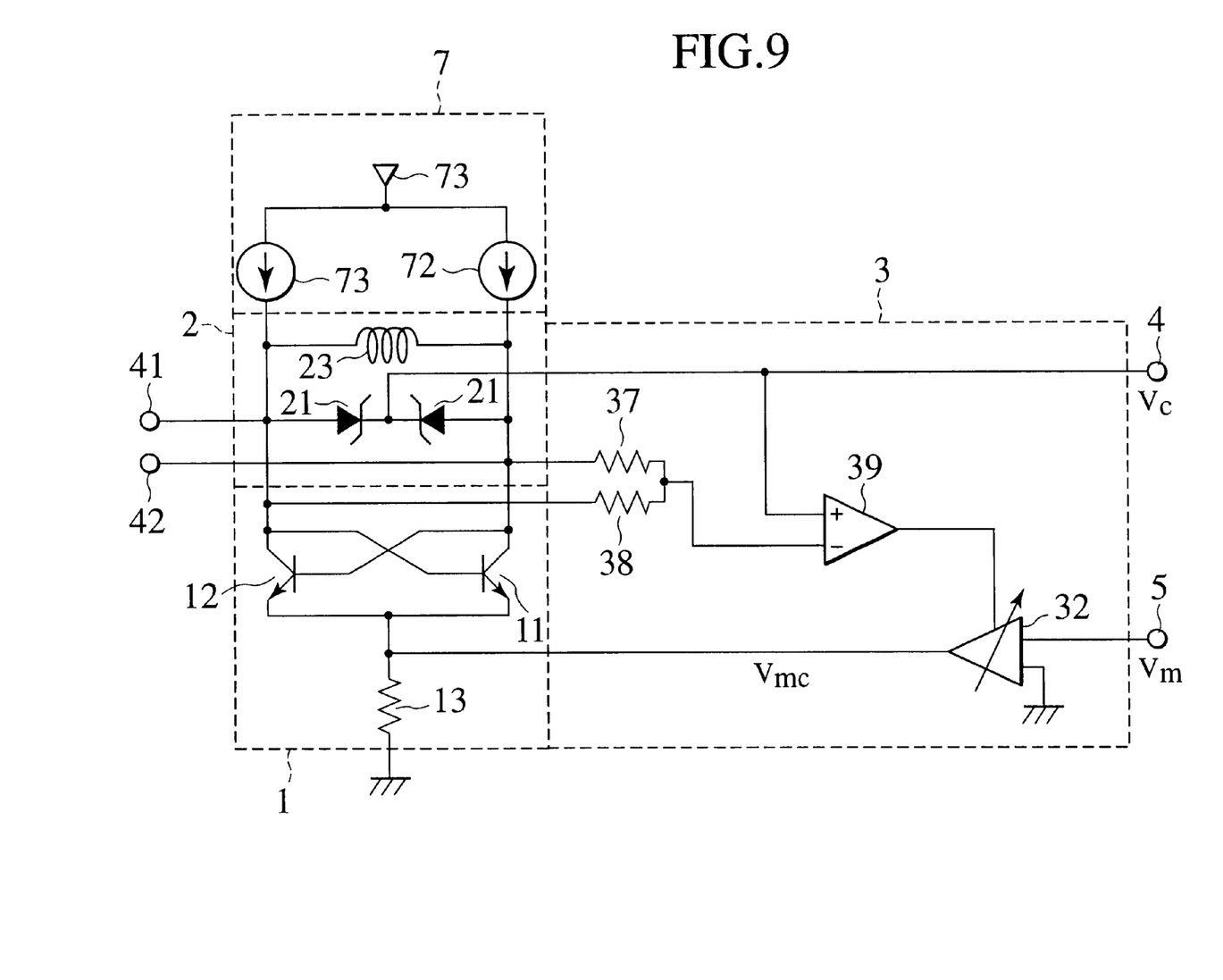
FIG. 9 is a circuit diagram showing an FM signal oscillator circuit according to a third embodiment of the present invention.

FIG. 9 is a circuit diagram showing an FM signal oscillator circuit according to the third embodiment of the present invention. This circuit includes a driver 1, a resonator 2, a modulating signal corrector 3, and a current supply circuit 7. The driver 1 and resonator 2 form a differential voltage controlled oscillator.

The driver 1 includes oscillating transistors 11 and 12 and a resistor 13. The resonator 2 includes two variable capacitance diodes 21 and a coil 23. The diodes 21 have graded junctions and commonly-connected cathodes. The corrector 3 includes a comparator 39, a variable gain amplifier 32, and resistors 37 and 38. The resistors 37 and 38 pick up a midpoint voltage of the diodes 21.

The operation of the third embodiment will be explained. A control voltage Vc is received through a frequency control input terminal 4 and is applied to a positive input terminal of the comparator 39. The control voltage Vc is also applied to the cathodes of the diodes 21. A negative input terminal of the comparator 39 receives an anode voltage of the diodes 21 through the resistors 37 and 38. The comparator 39 compares the control voltage Vc with the anode voltage and provides a differential voltage (corresponding to a terminal voltage of the diodes 21) to a control terminal of the variable gain amplifier 32, to set an amplification gain of the amplifier 32.

A modulating signal Vm is received through an input terminal 5 and is amplified by the amplifier 32 according to the set gain, to provide an amplified modulating signal Vmc. The signal Vmc is supplied to a common emitter of the transistors 11 and 12 of the driver 1.

Namely, the diodes 21 receive the sum of Vc and Vmc, so that the capacitance of the diodes 21 is set according to the control voltage Vc and is minutely changed according to the amplified modulating signal Vmc. As a result, the oscillating transistors 11 and 12 of the driver 1 produce an FM oscillating signal having a center frequency of fo, and the oscillating output (differential output) is provided outside from output terminals 41 and 42 connected to collectors of the transistors 11 and 12. The current supply circuit 7 has current sources 71 and 72 that receive a reference voltage and provide operation currents to the driver 1 through the resonator 2. A modulation level of the FM signal is determined by the level of the amplified modulating signal Vmc and is controlled by the gain of the amplifier 32 that is dependent on the control voltage Vc.

In this way, the third embodiment applies the sum of Vc and Vmc to the diode 21. In this respect, the third embodiment is similar to the first embodiment of FIG. 4. The third embodiment forms the resonator 2 with the variable capacitance diodes 21 of graded junction manufacturable through standard IC manufacturing processes. When the oscillation frequency fo is changed by changing the control voltage Vc, the third embodiment maintains a constant modulation level of the modulating signal Vmc, like the first embodiment.

Although the embodiments explained above employ graded-junction diodes as the variable capacitance diodes 21, the present invention may also employ abrupt-junction diodes as the diodes 21 with the same modulating signal corrector 3, to realize the effect of the present invention.

It must be understood that the above-mentioned embodiments do not limit the present invention and that many structural, functional, operational, and effectual modifications will be possible on the embodiments of the present invention without departing from the spirit of the present invention.

As mentioned above, the present invention employs graded- or abrupt-junction variable capacitance diodes to fabricate a resonator of an FM signal oscillator circuit that is capable of maintaining a constant modulation level when an oscillation frequency is changed. Due to the graded- or abrupt-junction diodes, this oscillator circuit is manufacturable through standard IC manufacturing processes at low cost.

What is claimed is:
1. An FM signal oscillator circuit comprising:
   a resonator having a variable capacitance diode whose capacitance is set according to a control voltage, the variable capacitance diode changing a resonance frequency of the resonator;
   a driver configured to drive the resonator and providing an FM signal; and a corrector configured to correct the level of a modulating signal according to resonance-frequency-changing characteristics of the resonator and apply a signal corresponding to the corrected modulating signal and a signal corresponding to the control voltage to the variable capacitance diode, the corrector comprising,
an operational amplifier configured to amplify the control voltage,
a variable gain amplifier configured to amplify the modulating signal according to the amplified control voltage, and
an adder configured to add the control voltage and the amplified modulating signal to each other, and the adder further configured to apply the sum to the variable capacitance diode.

2. The FM signal oscillator circuit as claimed in claim 1, wherein:
the corrector changes the level of the modulating signal according to a terminal voltage of the variable capacitance diode.

3. The FM signal oscillator circuit as claimed in claim 1, wherein:
the corrector changes the level of the modulating signal according to the control voltage.

4. The FM signal oscillator circuit as claimed in claim 3, wherein:
the corrector has a variable gain amplifier that changes an amplification gain according to the control voltage and sets the level of the modulating signal.

5. The FM signal oscillator circuit as claimed in claim 1, wherein the variable capacitance diode has one of a graded junction and an abrupt junction.

6. The FM signal oscillator circuit as claimed in claim 1, wherein the FM signal oscillator circuit is a semiconductor integrated circuit.

7. An FM signal oscillator circuit comprising:
a resonator having a variable capacitance diode whose capacitance is set according to a control voltage, the variable capacitance diode changing a resonance frequency of the resonator;
a driver configured to drive the resonator and providing an FM signal; and
a corrector configured to correct the level of a modulating signal according to resonance-frequency-changing characteristics of the resonator and apply a signal corresponding to the corrected modulating signal and a signal corresponding to the control voltage to the variable capacitance diode, the corrector comprising,
an operational amplifier configured to amplify the control voltage, and
a variable gain amplifier configured to amplify the modulating signal according to the amplified control voltage,
the corrector applying the control voltage and the amplified modulating signal to opposite ends of the variable capacitance diode, respectively.

8. An FM signal oscillator circuit comprising:
a resonator having a variable capacitance diode whose capacitance is set according to a control voltage, the variable capacitance diode changing a resonance frequency of the resonator, the resonator including two variable capacitance diodes to form, together with the driver, a differential voltage controlled oscillator;
a driver configured to drive the resonator and providing an FM signal; and a corrector configured to correct the level of a modulating signal according to resonance-frequency-changing characteristics of the resonator and apply a signal corresponding to the corrected modulating signal and a signal corresponding to the control voltage to the variable capacitance diode, the corrector comprising,
a comparator configured to compare a signal corresponding to the control voltage applied to a common cathode of the variable capacitance diodes with a signal corresponding to an anode voltage of the variable capacitance diodes and providing a differential voltage based on the compared voltages, and
a variable gain amplifier whose amplification gain is changed according to the differential voltage, configured to set the level of the modulating signal.

9. A modulation level controlling method for an oscillator having a variable capacitance element to provide an FM signal having a center frequency determined by a control signal and modulated by a modulating signal, the method comprising:
amplifying the control signal;
amplifying the modulating signal according to a gain determined by the amplified control signal;
adding the amplified modulating signal to the control signal, to form a sum signal; and
applying the sum signal to the variable capacitance element to control a resonance frequency in the oscillator.

10. The method as claimed in claim 9, wherein the modulating signal is amplified in such a way as to maintain a constant modulation gain for an oscillation frequency of the oscillator.

11. A modulation level controlling method for an oscillator having a variable capacitance element to provide an FM signal having a center frequency determined by a control signal and modulated by a modulating signal, the method comprising:
amplifying the control signal;
amplifying the modulating signal according to a gain determined by the amplified control signal; and
superimposing the amplified modulating signal on the control signal in such a way as to maintain a constant modulation gain for an oscillation frequency of the oscillator with respect to the modulating signal, and applying the superimposed signal to the variable capacitance element to control a resonance frequency in the oscillator.

12. A modulation level controlling method for an oscillator having a variable capacitance element to provide an FM signal having a center frequency determined by a control signal and modulated by a modulating signal, the method comprising:
extracting a terminal voltage of the variable capacitance element based on the control signal serving as a comparison reference;
amplifying the modulating signal by a gain determined from the extracted terminal voltage; and
supplying the amplified modulating signal to the oscillator to control a resonance frequency in the oscillator in such a way as to maintain a constant modulation gain for an oscillation frequency of the oscillator with respect to the modulating signal.

13. The FM signal oscillator circuit as claimed in claim 7, wherein:

the corrector changes the level of the modulating signal according to a terminal voltage of the variable capacitance diode.

14. The FM signal oscillator circuit as claimed in claim 7, wherein:

the corrector changes the level of the modulating signal according to the control voltage.

15. The FM signal oscillator circuit as claimed in claim 14, wherein:

the corrector has a variable gain amplifier that changes an amplification gain according to the control voltage and sets the level of the modulating signal.

16. The FM signal oscillator circuit as claimed in claim 8, wherein:

the corrector changes the level of the modulating signal according to a terminal voltage of the variable capacitance diode.

17. The FM signal oscillator circuit as claimed in claim 8, wherein:

the corrector changes the level of the modulating signal according to the control voltage.

18. The FM signal oscillator circuit as claimed in claim 17, wherein:

the corrector has a variable gain amplifier that changes an amplification gain according to the control voltage and sets the level of the modulating signal.

19. The FM signal oscillator circuit as claimed in claim 7, wherein the variable capacitance diode has one of a graded junction and an abrupt junction.

20. The FM signal oscillator circuit as claimed in claim 8, wherein the variable capacitance diode has one of a graded junction and an abrupt junction.

21. The FM signal oscillator circuit as claimed in claim 7, wherein the FM signal oscillator circuit is a semiconductor integrated circuit.

22. The FM signal oscillator circuit as claimed in claim 8, wherein the FM signal oscillator circuit is a semiconductor integrated circuit.

* * * * *